(12) United States Patent
Tsuji et al.

(10) Patent No.: US 6,441,444 B1
(45) Date of Patent: Aug. 27, 2002

(54) SEMICONDUCTOR DEVICE HAVING A NITRIDE BARRIER FOR PREVENTING FORMATION OF STRUCTURAL DEFECTS

(75) Inventors: Naoki Tsuji; Kiyoteru Kobayashi, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/352,401

(22) Filed: Jul. 14, 1999

(30) Foreign Application Priority Data

Oct. 22, 1998 (JP) .......................... 10-301010

(51) Int. Cl.$^7$ .............................................. H01L 29/76
(52) U.S. Cl. .................... 257/374; 257/330; 257/510; 257/511; 257/512; 257/586; 257/618; 430/221
(58) Field of Search ................... 257/330, 374, 257/510, 511, 512, 586, 618; 438/221

(56) References Cited

U.S. PATENT DOCUMENTS

| | | | |
|---|---|---|---|
| 5,668,403 A | | 9/1997 | Kunikiyo |
| 5,838,056 A | * | 11/1998 | Kasai et al. ................. 257/411 |
| 5,859,451 A | * | 1/1999 | Narita ......................... 257/306 |
| 5,859,459 A | * | 1/1999 | Ikeda .......................... 257/374 |
| 5,874,769 A | * | 2/1999 | Chan et al. .................. 257/510 |
| 5,917,225 A | * | 6/1999 | Ymazaki et al. ............. 257/411 |
| 5,952,707 A | * | 9/1999 | Hodges ....................... 257/510 |
| 5,959,322 A | * | 9/1999 | Lee ............................. 257/298 |
| 5,966,598 A | * | 10/1999 | Yamazaki .................... 438/221 |

FOREIGN PATENT DOCUMENTS

| | | | | |
|---|---|---|---|---|
| JP | 361003449 | * | 1/1986 | ................. 257/374 |
| JP | 61-174737 | | 8/1986 | |
| JP | 404162574 | * | 6/1992 | ................. 257/374 |
| JP | 4-346229 | | 12/1992 | |
| JP | 1126568 | | 1/1999 | |
| JP | 3064994 | | 5/1999 | |
| JP | 11135615 | | 5/1999 | |

* cited by examiner

Primary Examiner—Jerome Jackson, Jr.
Assistant Examiner—Edgardo Ortiz

(57) ABSTRACT

Providing a method of producing a semiconductor device and a structure of the semiconductor device employing a trench isolation structure for isolating semiconductor elements wherein volumetric expansion of a trench-filling material due to oxidation process after forming the trench isolation structure is controlled thereby making it possible to prevent deterioration of the electrical characteristics of the semiconductor device. A nitriding treatment is applied to the trench surface of the silicon substrate after forming the trench by etching, thereby to form a thin nitride layer having a better effect of preventing oxidation in the interface of silicon.

11 Claims, 12 Drawing Sheets

SEMICONDUCTOR DEVICE HAVING A NITRIDE BARRIER FOR PREVENTING FORMATION OF STRUCTURAL DEFECTS

BACKGROUND OF THE INVENTION

1. Field of the Invention

The present invention relates to a semiconductor device, and a method of producing the same. More particularly, it relates to a trench isolation structure for electrically isolating semiconductor elements.

2. Description of the Related Art

Trench isolation structure formed between semiconductor elements such as transistors has been becoming increasingly important as semiconductor devices are packaged with higher density and higher performance.

A method of producing trench isolation structure of the prior art used in the conventional semiconductor device will be described below with reference to FIGS. 12 through 21.

FIGS. 12 through 21 are cross sectional views showing first through tenth steps of the method of producing a trench isolation structure of the prior art.

First, referring to FIG. 12, a silicon oxide film 2 having thickness of 100 Å is grown on a principal plane of a P-type silicon substrate 1 by thermal oxidation process, followed by the deposition of a silicon nitride film 3 having thickness of 500 Å by low pressure CVD (Chemical Vapor Deposition) process and application of a resist to form a desired resist pattern 4 by photolithography technology.

After etching the silicon nitride film 3 and the silicon oxide film 2 with the resist pattern 4 used as a mask, the silicon substrate 1 is etched thereby to form a groove 5 having a depth of 4000 Å from the surface, and the resist pattern 4 is removed, as shown in FIG. 13.

Now referring to FIG. 14, where thermal oxidation is applied to the inner surface of the groove 5 formed in the silicon substrate 1, thereby to form a silicon oxide film 6 having thickness of 500 Å.

Then as shown in FIG. 15, the groove 5 is filled up by depositing a silicon oxide filling 7 to a depth of 6000 Å by CVD process. Surface of the silicon oxide filling 7 is smoothed by CMP (Chemical Mechanical Polishing) process.

Now referring to FIG. 16, where the silicon nitride film 3 is selectively removed by using thermal phosphoric acid, thus forming a trench isolation structure 30 comprising the groove 5, the silicon oxide film 6 and the silicon oxide filling 7.

After the isolation trench 30 has been formed as shown in FIG. 17, boron ions are implanted with a density of $3\times10^{12}/cm^2$ and an energy of 200 KeV by ion implantation process, thereby to form a channel stopper layer 35.

Now referring to FIG. 18, where the silicon oxide film 2 is removed by using hydrofluoric acid (HF) solution.

Now referring to FIG. 19, where a silicon oxide film having thickness of 50 Å which would become a gate oxidation film 8 of a transistor is formed by thermal oxidation process, and phosphorus-doped polycrystal silicon is deposited to a thickness of about 3000 Å by low pressure CVD process. After forming a desired resist pattern 10 by the photolithography technology, the phosphorus-doped polycrystal silicon is etched with the resist pattern 10 used as a mask, thereby forming a gate electrode 9.

Then as shown in FIG. 20, after removing the resist pattern 10, arsenic ions are implanted with a density of $4\times10^{15}/cm^2$ at an energy of 50 KeV by ion implantation process, thereby to form an impurity-doped layer 11 of a conductivity type different from that of the silicon substrate 1. Then heat treatment is applied in nitrogen atmosphere at 800° C. for about 30 minutes, thereby to form an N-type diffusion layer 11 which is an impurity-doped layer by activating the arsenic ions. Thus an MOS (Metal Oxide Semiconductor) transistor 40 comprising the gate oxidation film 8, the gate electrode 9 and the impurity-doped layer 11 is formed.

Then as shown in FIG. 21, after depositing a silicon oxide film 12 having thickness of about 1000 Å by the CVD process, a boron phosphate glass 13 is deposited by the CVD process. After reflowing the boron phosphate glass 13 through heat treatment applied in nitrogen atmosphere at 850° C. for 30 minutes, a resist pattern (not shown) is formed by photolithography technology. The resist pattern is used as a mask in etching the boron phosphate glass 13 and the silicon oxide film 12 to make contact holes (not shown), followed by deposition of an aluminum-silicon-copper (Al—Si—Cu) alloy film by a sputtering technique.

Then a resist (not shown) is applied in a desired pattern by the photolithography technology, and the resist pattern is used as a mask for etching the aluminum-silicon-copper alloy film, thereby to form an aluminum-silicon-copper wiring 14.

The semiconductor device of the prior art is constructed as described above, while semiconductor elements such as transistor are electrically isolated from each other by the trench isolation structure.

In the semiconductor device of the prior art described above, while the gate oxidation film 8 of the transistor is formed by thermal oxidation process after forming the trench isolation structure 30 as shown in FIG. 19, an oxidation agent tends to diffuse into the silicon oxide filling 7, which is embedded in the groove, 5 and react with the silicon of the substrate 1 included in the inner wall of the groove 5, resulting in the oxidation of the silicon included in the inner wall of the groove 5. That is, oxidation of silicon in the reaction of $Si+O_2 \rightarrow SiO_2$ causes silicon to turn into a silicon oxide film, while the volume increases with the ratio of silicon to silicon oxide being 1:2. In the present case, since the groove 5 is filled with the silicon oxide filling 7, the increased volume causes a compressive stress in the silicon located near the groove 5. The compressive stress causes crystalline defects to be generated in the silicon located near the groove 5.

FIG. 22 is a diagram for explaining a mechanism wherein leak current flowing through an NP junction between an N-type diffusion layer (drain) 11a and a P⁻type silicon substrate 1 increases due to the generation of crystalline defects in the silicon located near the groove 5. In FIG. 22, when an N type diffusion layer (source) 11b and the P⁻type silicon substrate 1 are grounded with a voltage of 3.3 V applied to the gate electrode 9 and 3.3 V applied to the drain 11a to operate the MOS transistor, a depletion layer 19 is generated in the vicinity of the interface between the drain 11a and the P⁻type silicon substrate 1. At this time, in case there is crystalline defect 20 caused by the stress due to formation of the groove 5 in the silicon substrate 1, the depletion layer 19 may involve the crystalline defect 20 where electron-hole (21–22) pairs are generated, thereby increasing the leak current flowing through the NP junction between the drain 11a and the P⁻type silicon substrate 1.

In the semiconductor device which employs the trench isolation structure of the prior art, as described above, there has been such a problem that the stress, caused by volume expansion through the oxidation of the silicon after forming the trench isolation structure, thereby increasing junction leak current and consequently causing an increased current consumption in the semiconductor device.

SUMMARY OF THE INVENTION

The present invention has been attained to solve the problem described above, and an object of the present invention is to provide a semiconductor device wherein the current consumption is reduced by controlling the generation of crystalline defects, and another object of the present invention is to provide a method of producing the semiconductor device.

A semiconductor device of the first invention is a semiconductor device having a plurality of transistors comprising a semiconductor substrate of first conductivity type having a principal plane, a gate electrode formed on the principal plane via a gate oxidation film and impurity-doped layers of the second conductivity type formed on the principal plane on both sides of the gate electrode, wherein the plurality of transistors are isolated from each other by filling a groove formed by etching the semiconductor substrate with an insulating material, while a nitride layer is provided by nitriding the semiconductor in the inner surface of the groove.

A semiconductor device of the second invention is that wherein the nitride layer is formed by a nitriding treatment using a nitrogen monoxide gas.

A semiconductor device of the third invention is a semiconductor device, wherein the nitriding treatment is carried out at a temperature of not less than 800° C.

A semiconductor device of the fourth invention is a semiconductor device, wherein the nitriding treatment is carried out by using an ammonia gas.

A semiconductor device of the fifth invention is a semiconductor device, wherein the nitriding treatment carried out at a temperature of not less than 700° C.

A method of producing the semiconductor device according to the sixth invention is a method of producing the semiconductor device having a plurality of transistors comprising a semiconductor substrate of first conductivity type having a principal plane, a gate electrode formed on the principal plane via a gate oxidation film and impurity-doped layers of the second conductivity type formed on the principal plane on both sides of the gate electrode, wherein a step of isolating the plurality of transistors from each other comprises a step of forming a groove by etching the semiconductor substrate, a step of nitriding the semiconductor of the inner surface of the groove thereby to form a nitride layer, and a step of filling the groove with an insulating material.

A method of producing the semiconductor device according to the seventh invention is a method, wherein the step of forming the nitride layer comprises a step of carrying out the nitriding treatment using a nitrogen monoxide gas.

A method of producing the semiconductor device according to the eighth invention is a method, wherein the nitriding treatment is carried out at a temperature of not less than 800° C.

A method of producing the semiconductor device according to the ninth invention is a method, wherein the step of forming the nitride layer comprises a step of nitriding treatment carried out by using an ammonia gas.

A method of producing the semiconductor device according to the tenth invention is a method, wherein the nitriding treatment is carried out at a temperature of not less than 700° C.

The present invention, having the configuration described above, provides the following effects.

According to the first and the sixth inventions, since the plurality of transistors are isolated from each other and the nitride layer is formed on the inner surface of the groove which constitutes the trench isolation structure, expansion of the oxide film due to the oxidation treatment after filling the groove is suppressed thereby preventing crystalline defects from being generated due to the compressive stress generated in the semiconductor substrate, thus minimizing the leak current caused by crystalline defect and improving the characteristics of the junction, and therefore it is made possible to produce the semiconductor device of low power consumption and stable operation.

Further according to the second and the seventh inventions, the nitriding treatment can also be effectively performed from above the insulating material in which case nitrogen gas concentrates to the interface between the semiconductor substrate and the insulating material due to diffusion, thus forming a strong oxidation control layer.

Also according to the third and the eighth inventions, the nitride layer having sufficient oxidation control effect can be formed by applying the nitriding treatment with the nitrogen monoxide gas at a temperature of 800° C. or higher.

Further according to the fourth and the ninth inventions, ammonia gas can be applied from above the insulating material for the nitriding treatment in which case nitrogen concentrates to the interface between the semiconductor substrate and the insulating material due to diffusion, thus forming a strong oxidation control layer.

Also according to the fifth and the tenth inventions, the nitride layer having sufficient oxidation control effect can be formed by applying the nitriding treatment using ammonia gas at a temperature of 700° C. or higher.

DESCRIPTION OF THE PREFERRED EMBODIMENTS

Embodiment 1

Now the first embodiment of the present invention will be described below with reference to FIGS. 1 through 11.

Figure 1:
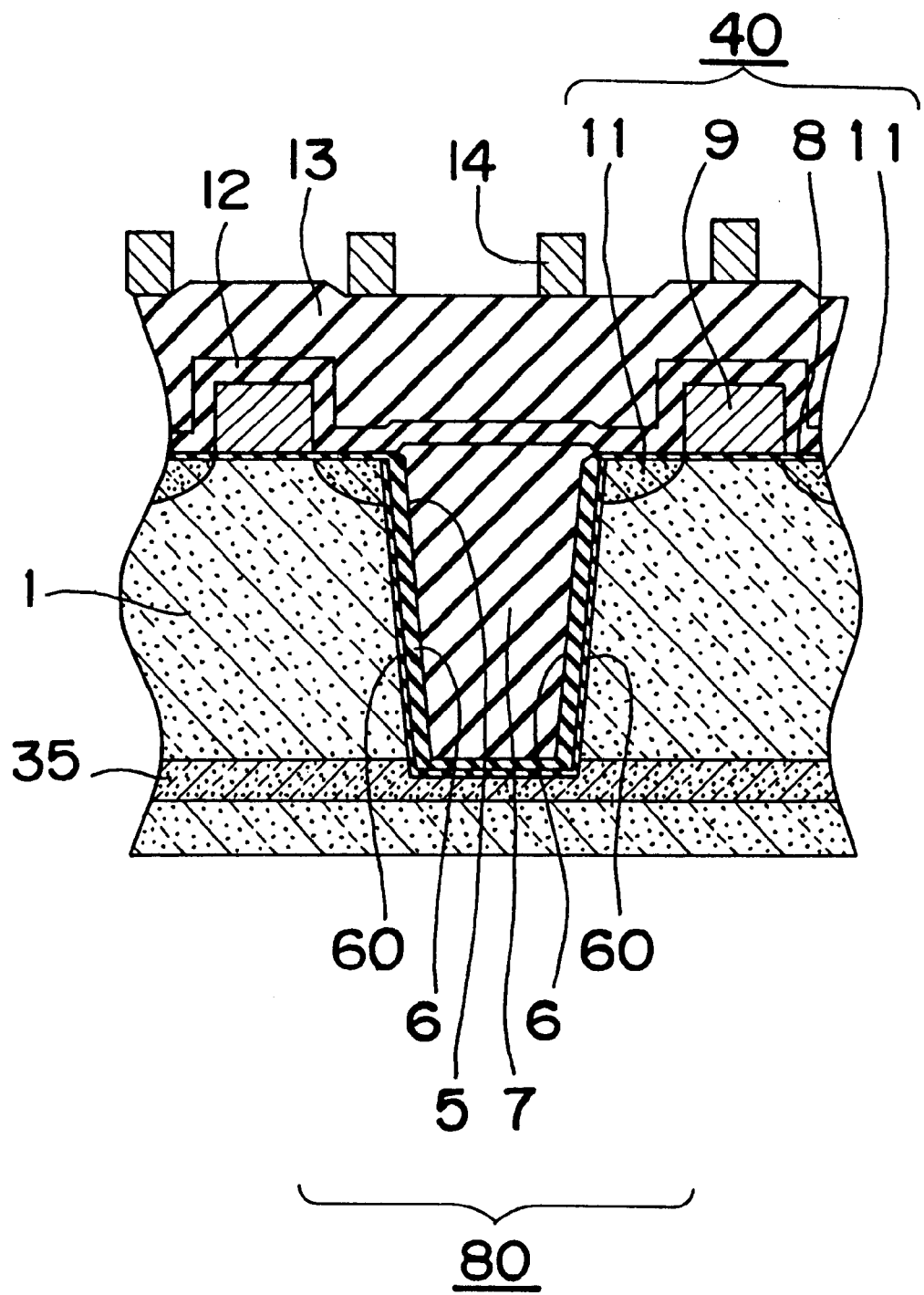
FIG. 1 is a cross sectional view owing the semiconductor device according to the first embodiment of the present invention.

FIG. 1 is a cross sectional view showing the semiconductor device according to the first embodiment of the present invention. In FIG. 1, numeral 1 denotes a P type silicon substrate which is a semiconductor substrate, 5 denotes a groove, 6 and 7 denote silicon oxide films, 8 denotes a silicon oxidation film which is a gate oxidation film, 9 denotes a gate electrode, 11 denotes an impurity-doped layer, 12 denotes a silicon oxide film, 13 denotes a boron phosphate glass, 14 denotes an aluminum-silicon-copper wiring, 35 denotes a channel stopper layer, 40 denotes an MOS transistor, 60 denotes a nitride layer and 80 denotes an isolation trench.

Figure 2:
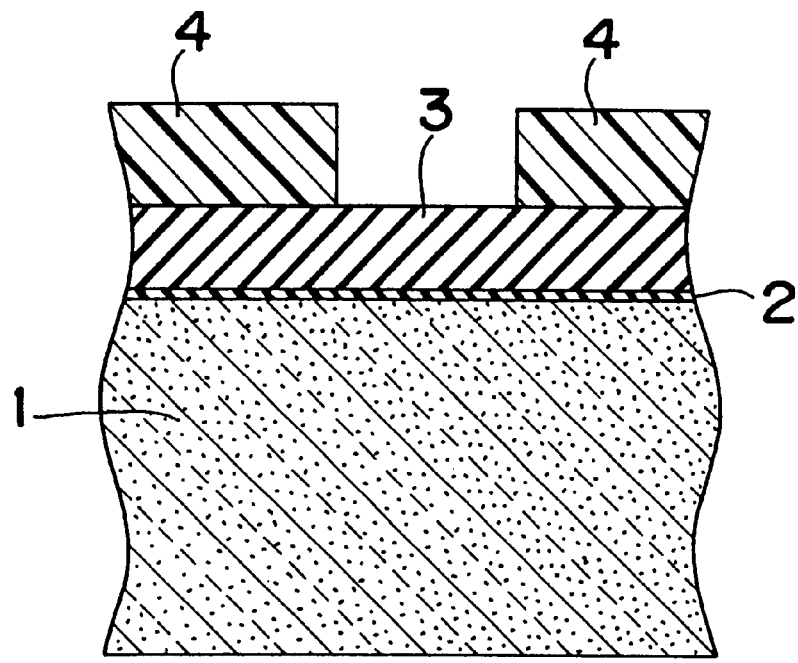
FIG. 2 is a cross sectional view showing a first step of the method of producing the semiconductor device according to the first embodiment of the present invention.
Figure 11:
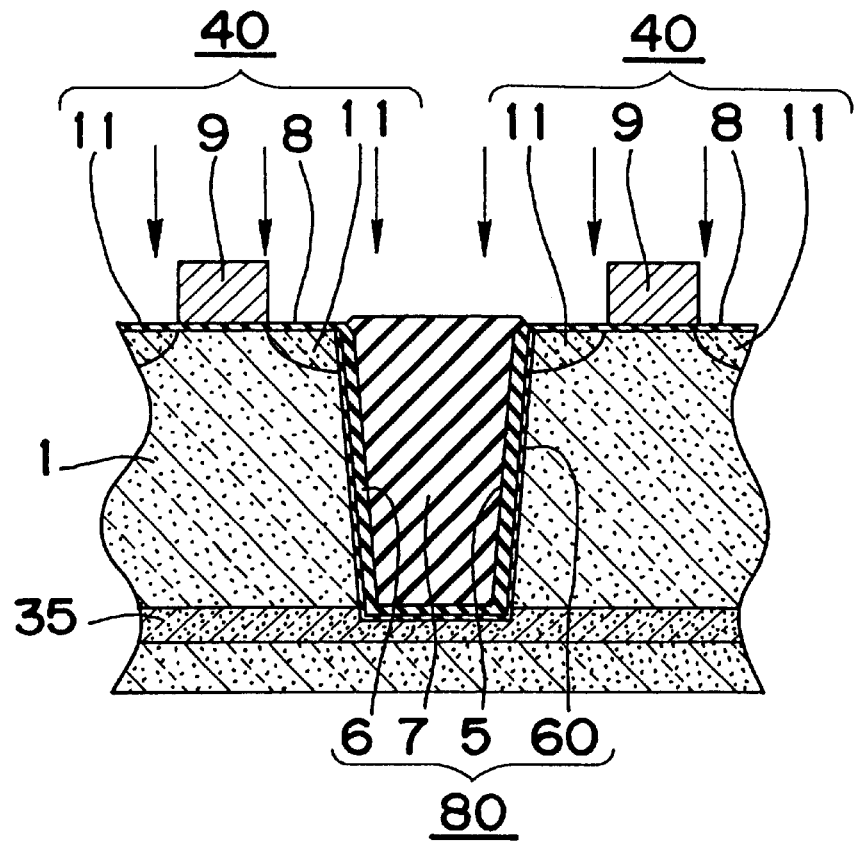
FIG. 11 is a cross sectional view showing a tenth step of the method of producing the semiconductor device according to the first embodiment of the present invention.
Figure 12:
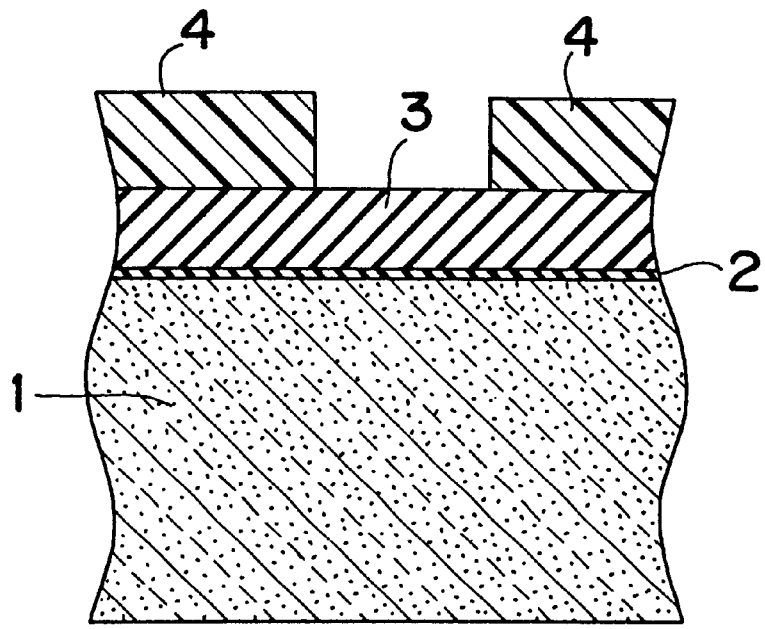
FIG. 12 is a cross sectional view showing a first step of the method of producing the semiconductor device of the prior art.
Figure 13:
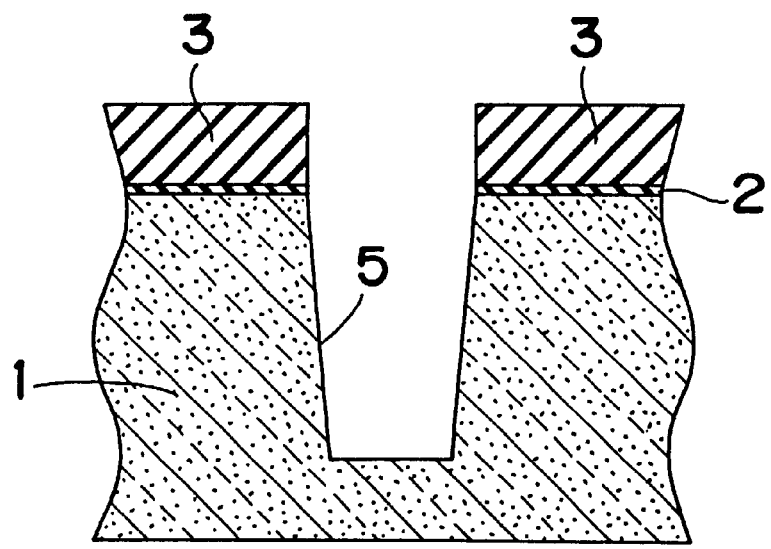
FIG. 13 is a cross sectional view showing a second step of the method of producing the semiconductor device of the prior art.
Figure 14:
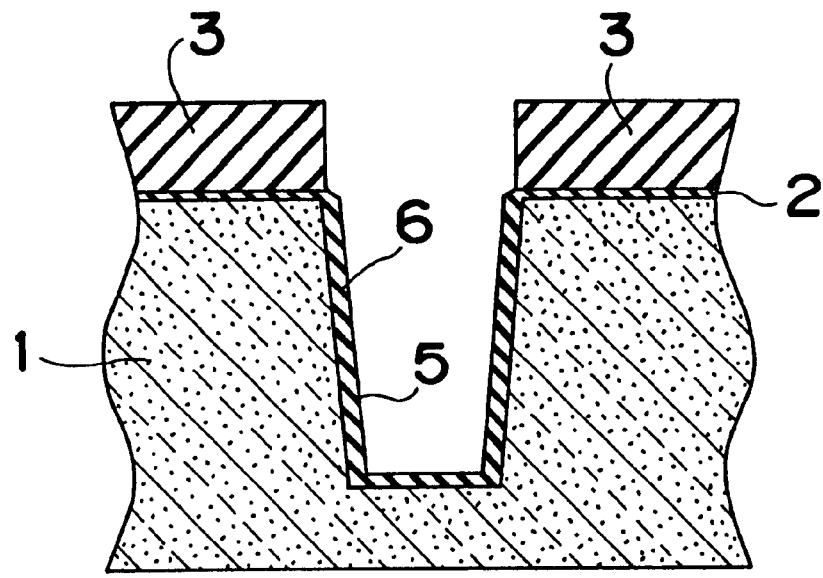
FIG. 14 is a cross sectional view showing a third step of the method of producing the semiconductor device of the prior art.
Figure 15:
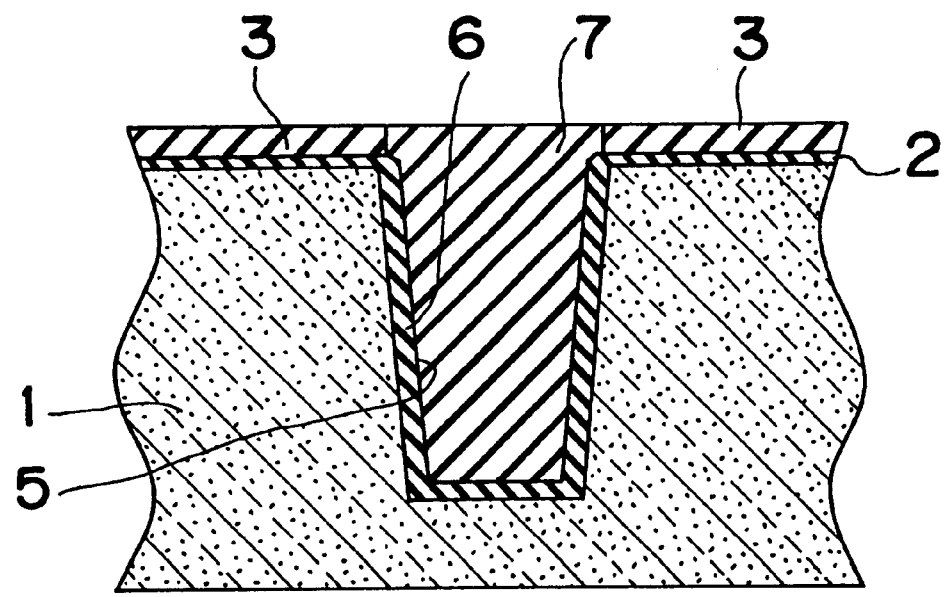
FIG. 15 is a cross sectional view showing a fourth step of the method of producing the semiconductor device of the prior art.
Figure 16:
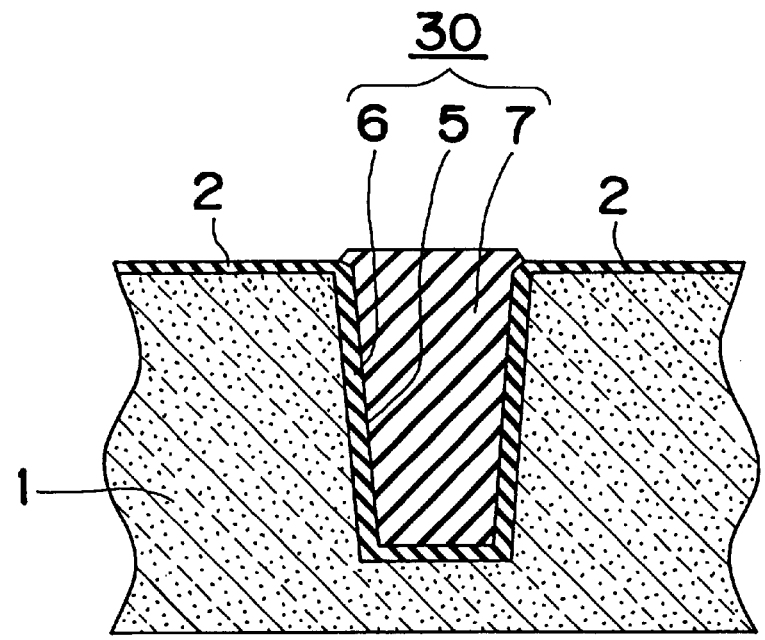
FIG. 16 is a cross sectional view showing a fifth step of the method of producing the semiconductor device of the prior art.
Figure 17:
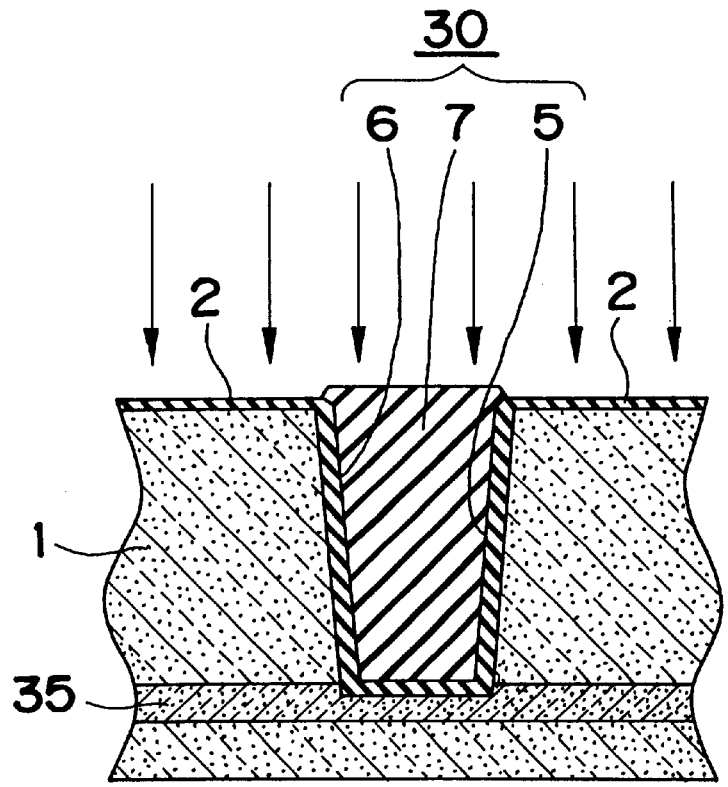
FIG. 17 is a cross sectional view showing a sixth step of the method of producing the semiconductor device of the prior art.
Figure 18:
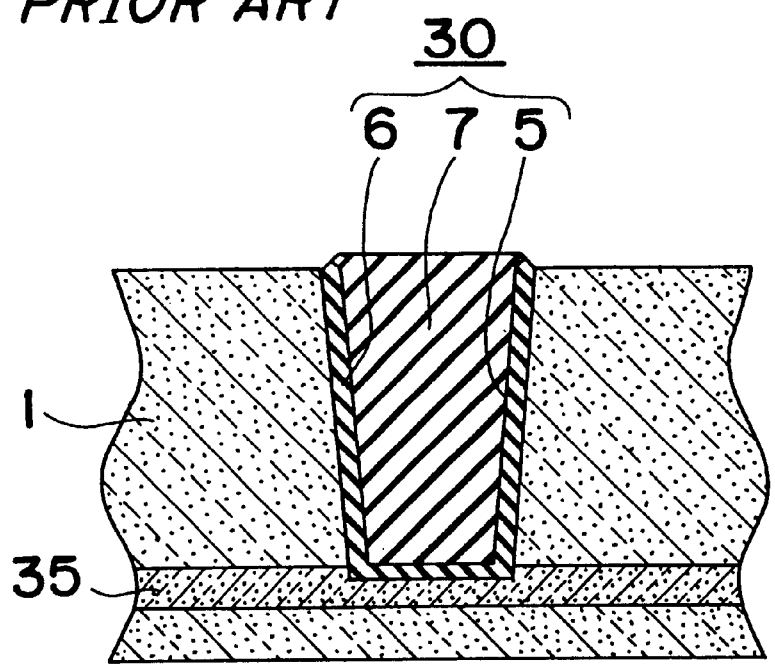
FIG. 18 is a cross sectional view showing a seventh step of the method of producing the semiconductor device of the prior art.
Figure 19:
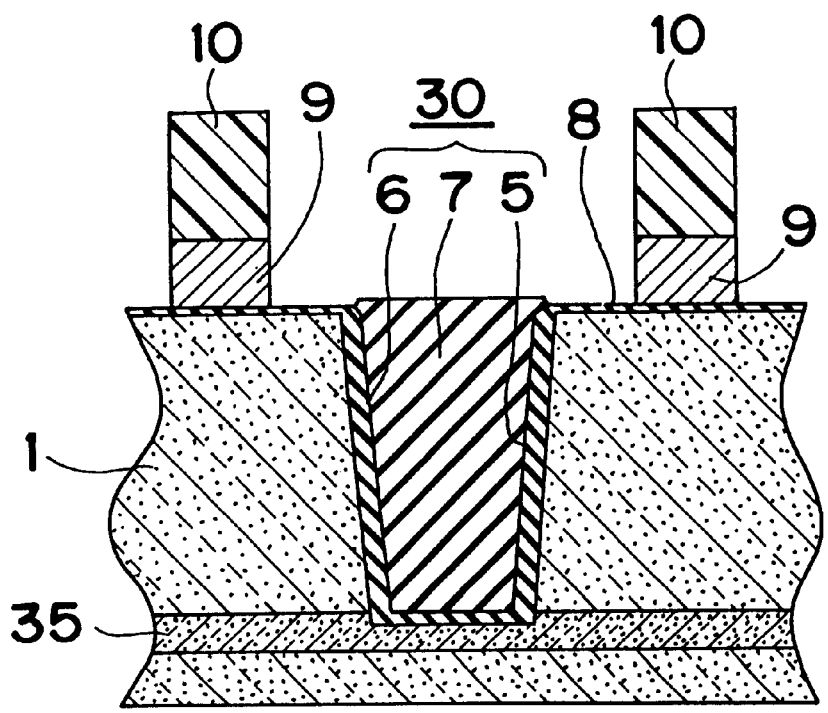
FIG. 19 is a cross sectional view showing an eighth step of the method of producing the semiconductor device of the prior art.
Figure 20:
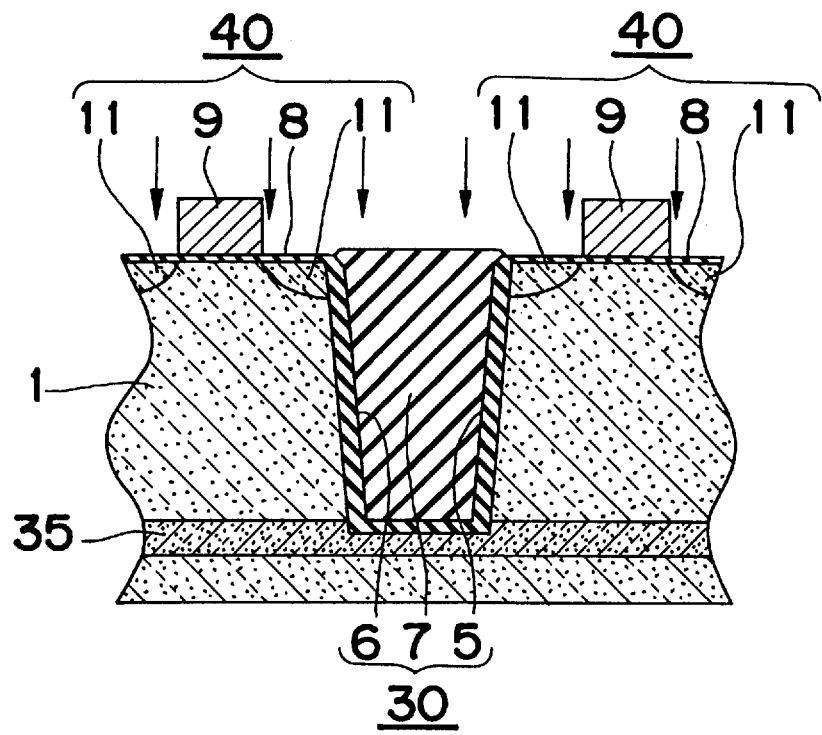
FIG. 20 is a cross sectional view showing a ninth step of the method of producing the semiconductor device of the prior art.
Figure 21:
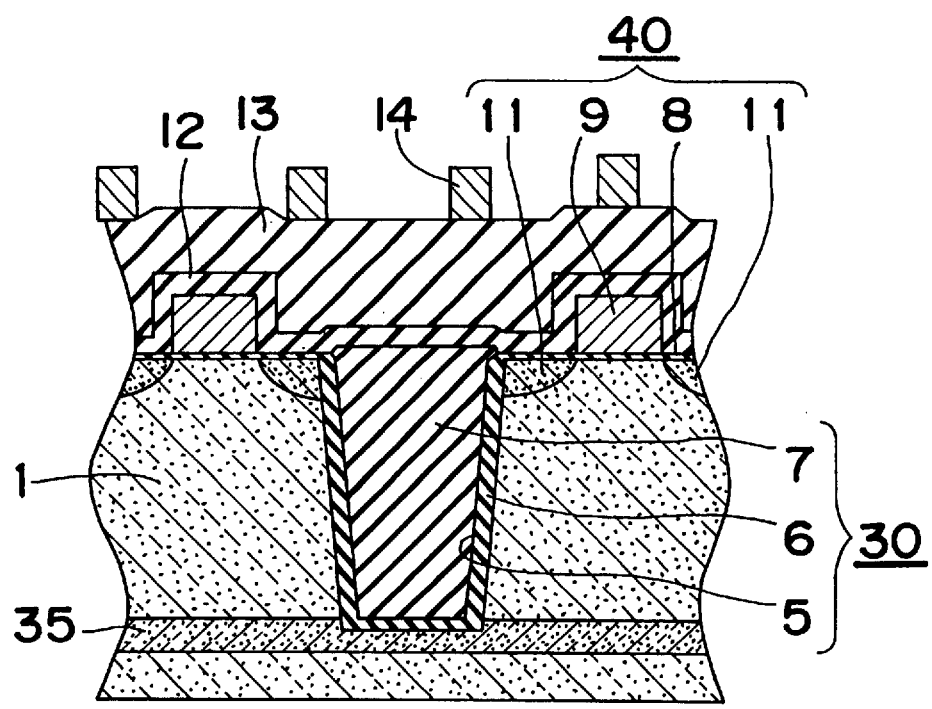
FIG. 21 is a cross sectional view showing a tenth step of the method of producing the semiconductor device of the prior art.
Figure 22:
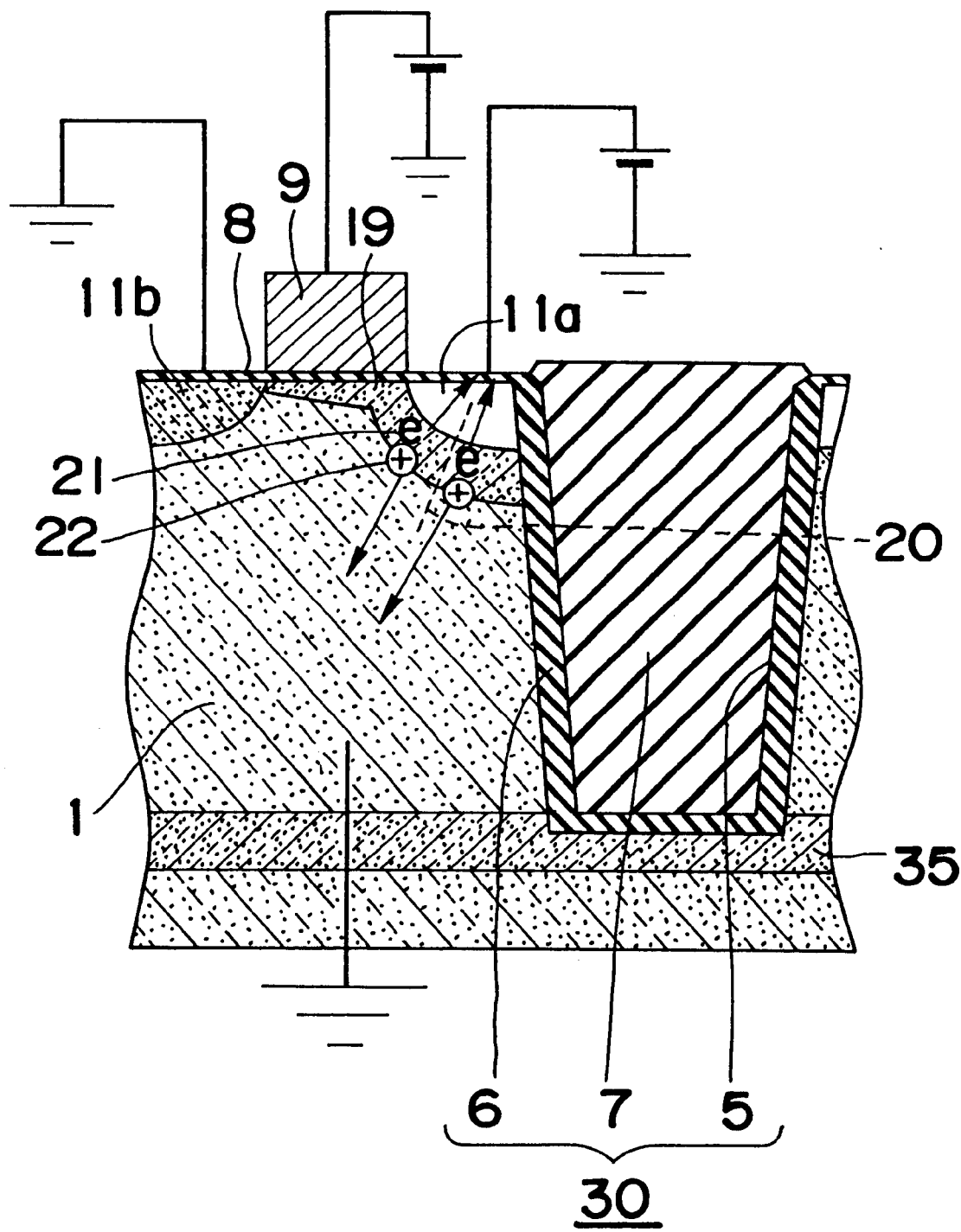
FIG. 22 is a diagram for explaining the increasing leak current through transistor junction due to crystalline defect induced by the conventional trench isolation employed in the semiconductor device of the prior art.

Now a method of producing the semiconductor device will be described below with reference to FIGS. 2 through FIGS. 2 through 11 show first through tenth step for making the trench isolation structure used in the semiconductor device shown in FIG. 1.

First, with reference to FIG. 2, the silicon oxide film 2 having a thickness of 100 Å is grown on the surface of the P type silicon substrate 1 which is a semiconductor substrate by thermal oxidation step, followed by deposition of the silicon nitride film 3 having a thickness of 500 Å by low pressure CVD process, and then a desired pattern of resist 4 is formed by the photolithography technology.

Figure 3:
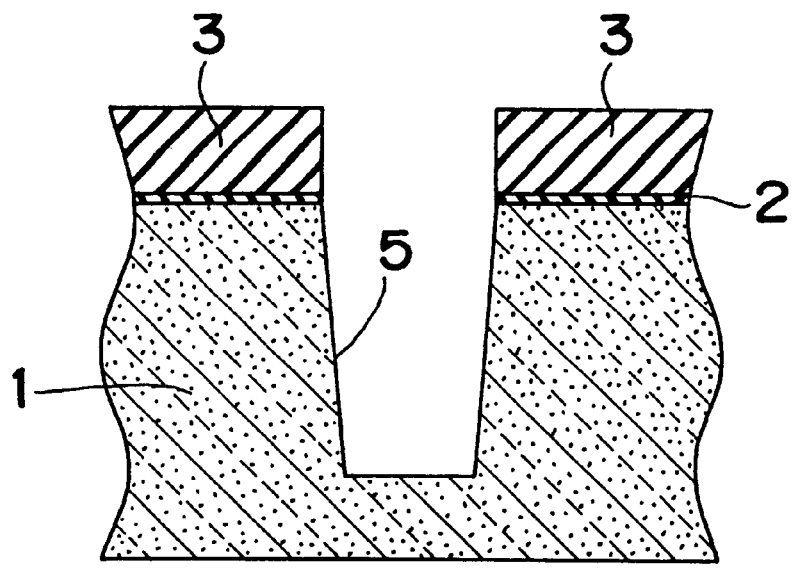
FIG. 3 is a cross sectional view showing a second step of the method of producing the semiconductor device according to the first embodiment of the present invention.

Then as shown in FIG. 3, the resist pattern 4 is used as a mask in etching of the silicon nitride film 3 and the silicon oxide film 2, surface of the silicon substrate is etched to form the groove 5 having a depth of 4000 Å and the resist pattern 4 is removed.

Figure 4:
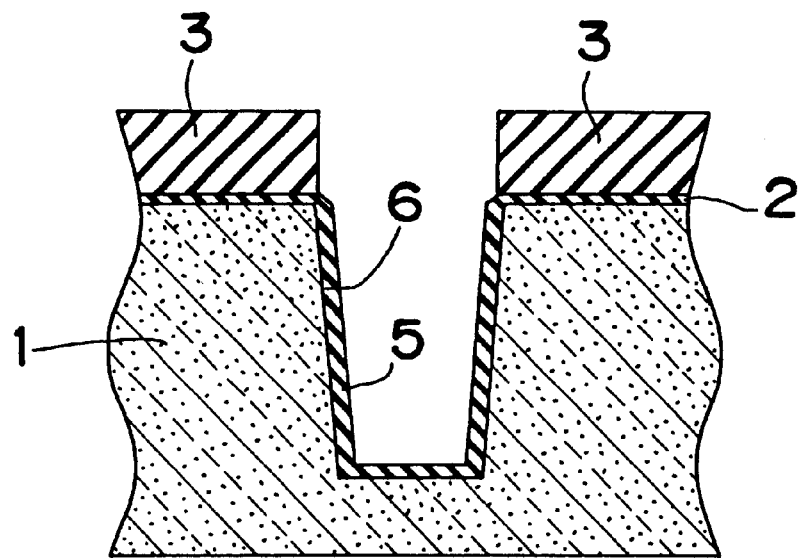
FIG. 4 is a cross sectional view showing a third step of the method of producing the semiconductor device according to the first embodiment of the present invention.

Then as shown in FIG. 4, thermal oxidation is applied to the inner surface of the groove 5 in the silicon substrate thereby to form the silicon oxide film 6 having a thickness of 500 Å.

Figure 5:
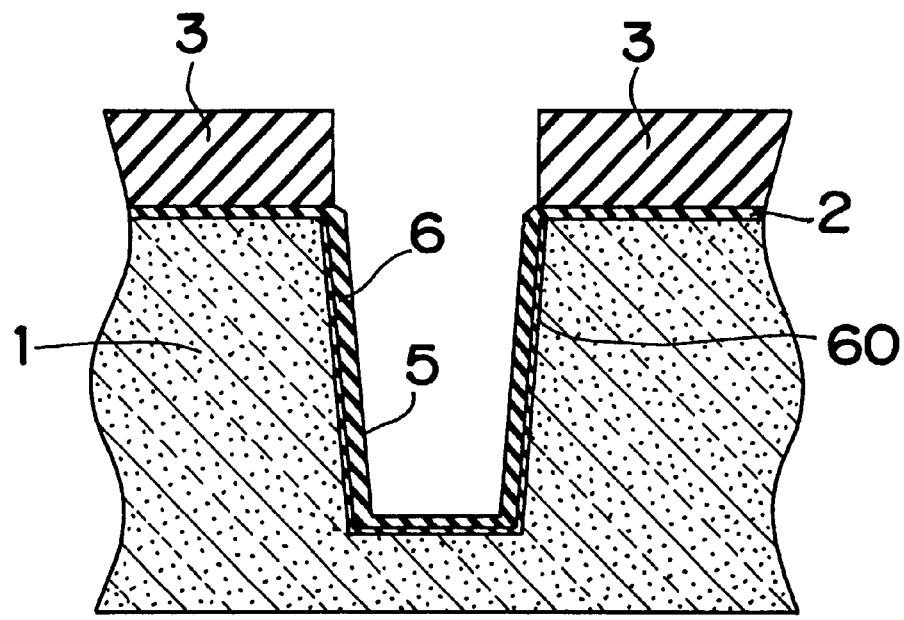
FIG. 5 is a cross sectional view showing a fourth step of the method of producing the semiconductor device according to the first embodiment of the present invention.

Now with reference to FIG. 5, the silicon oxide film 6 is annealed at a temperature of 800° C. or higher in nitrogen monoxide (NO) gas atmosphere which has nitriding effect, thereby to nitride the inner surface of the groove 5 in the silicon substrat e 1 and form the nitride layer 60 made by nitriding of silicon included in the inner surface of the silicon substrate 1. Nitriding can be effectively performed even when applied from above the silicon oxide film 6 since nitrogen concentrates to the interface between the silicon substrate 1 and the silicon oxide film 6 due to diffusion. The same nitriding effect can also be achieved without the silicon oxide film 6, and therefore nitriding process can be applied to a structure without the silicon oxide film 6. Also the nitriding treatment may not necessarily be done by using nitrogen monoxide gas, and ammonia gas or the like which has an action to nitride the silicon surface may be employed.

Figure 6:
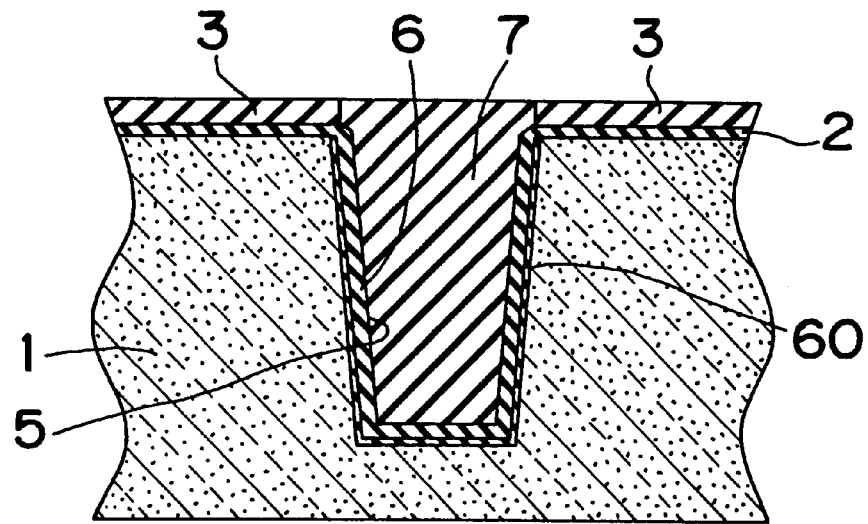
FIG. 6 is a cross sectional view showing a fifth step of the method of producing the semiconductor device according to the first embodiment of the present invention.

Then as shown in FIG. 6, the groove 5 is filled up by depositing a silicon oxide filling 7 to a depth of 6000 Å by the CVD process. Surface of the silicon oxide filling 7 is then smoothed by the CMP process.

Figure 7:
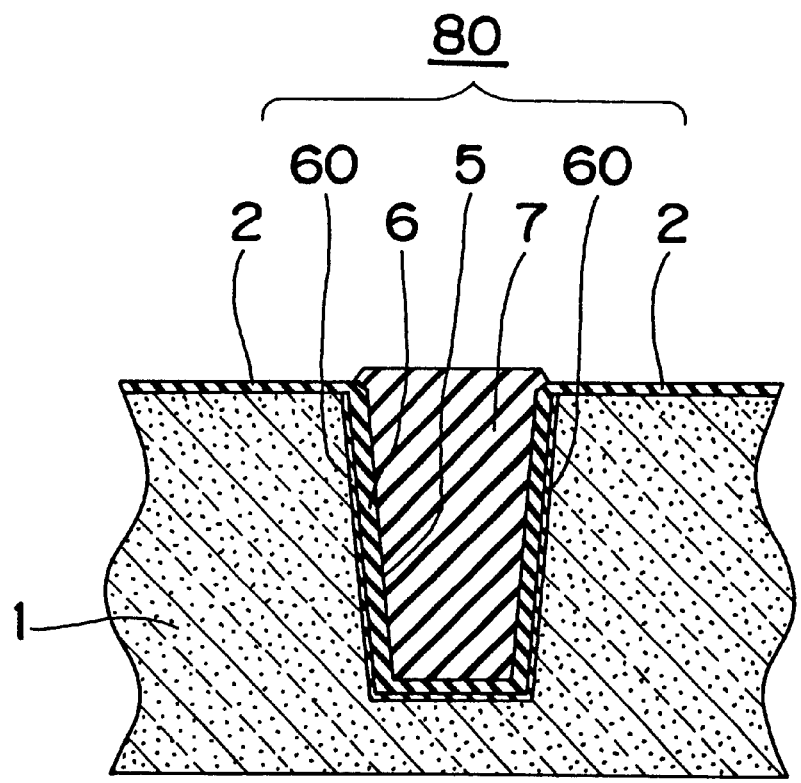
FIG. 7 is a cross sectional view showing a sixth step of the method of producing the semiconductor device according to the first embodiment of the present invention.

Then as shown in FIG. 7, the silicon nitride film 3 is selectively removed using thermal phosphoric acid, thus forming a trench isolation structure 80 according to the first embodiment comprising the groove 5, the silicon oxide film 6, the silicon oxide filling 7 and the nitride layer 60.

Figure 8:
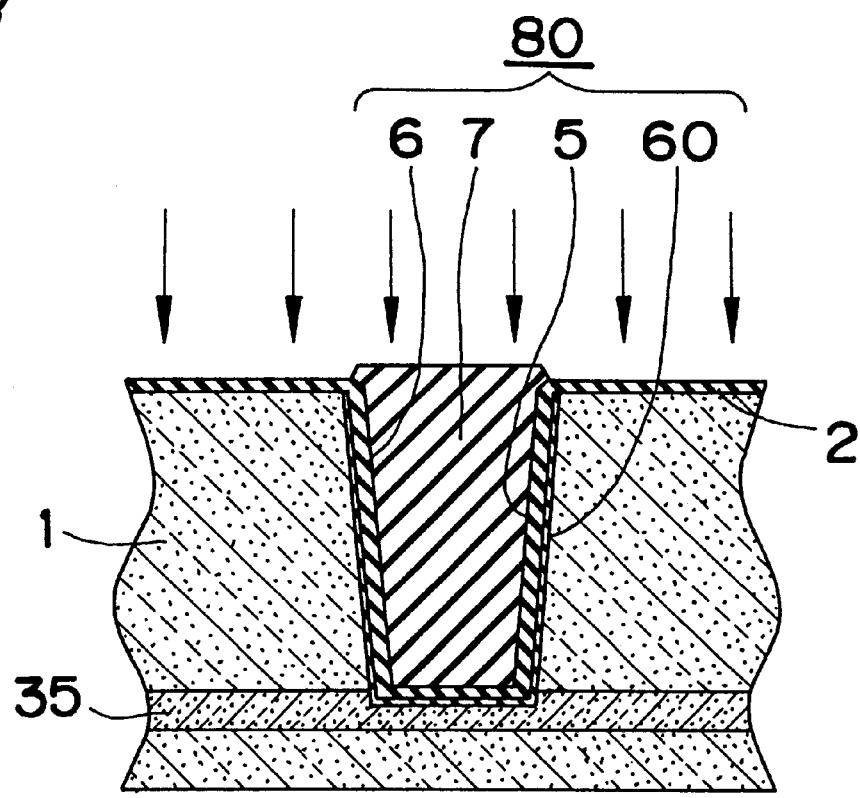
FIG. 8 is a cross sectional view showing a seventh step of the method of producing the semiconductor device according to the first embodiment of the present invention.

Now taking reference to FIG. 8, boron ions are implanted with a density of $3 \times 10^{12}/cm^2$ and an energy of 200 KeV by ion implantation process, thereby to form the channel stopper layer 35.

Figure 9:
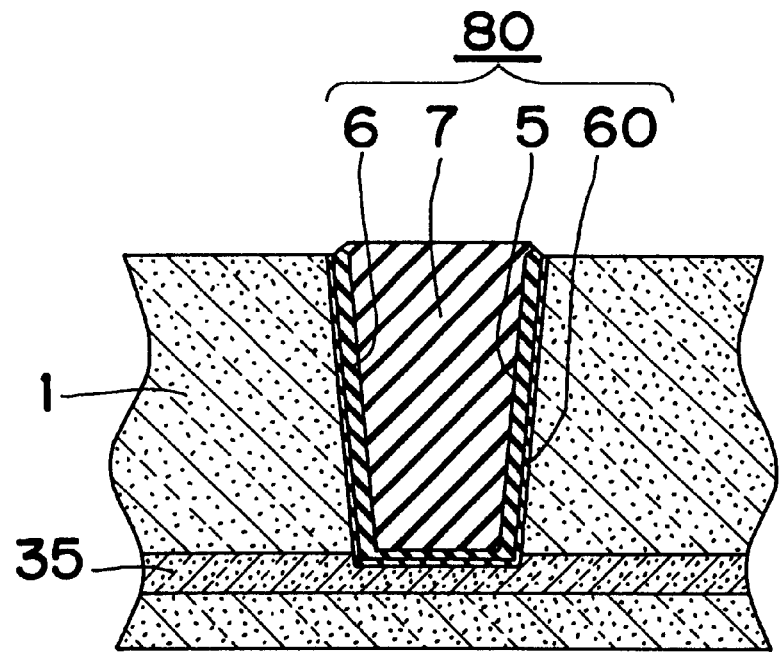
FIG. 9 is a cross sectional view showing an eighth step of the method of producing the semiconductor device according to the first embodiment of the present invention.

Then as shown in FIG. 9, the silicon oxide film 2 is removed by using hydrofluoric acid solution.

Figure 10:
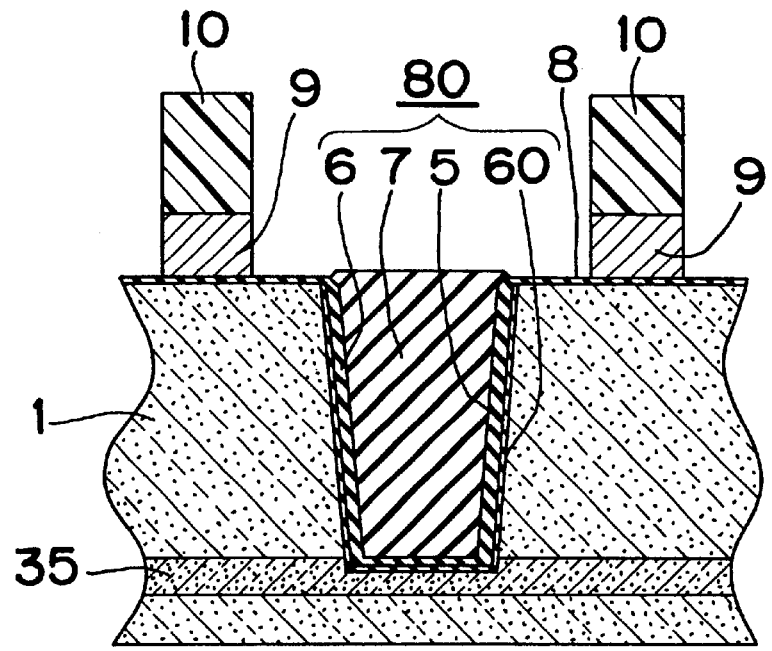
FIG. 10 is a cross sectional view showing a ninth step of the method of producing the semiconductor device according to the first embodiment of the present invention.

Then as shown in FIG. 10, a silicon oxide film having a thickness of 50 Å which would become the gate oxidation film 8 of a transistor is grown by the thermal oxidation process, a phosphorus-doped polycrystal silicon is deposited to a thickness of about 3000 Å by the low pressure CVD process and, after forming a desired resist pattern 10 by the photolithography technology, the phosphorus-doped polycrystal silicon is etched with the resist pattern 10 used as a mask, thereby forming the gate electrode 9.

Then as shown in FIG. 11, after removing the resist pattern 10, arsenic ions are implanted with a density of $4 \times 10^{15}/cm^2$ and an energy of 50 KeV by the ion implantation process, thereby to form the impurity-doped layer 11 of a conductivity type different from that of the silicon substrate 1. Then heat treatment is applied in nitrogen atmosphere at 800° C. for about 30 minutes, thereby to form the N-type diffusion layer 11 which is an impurity-doped layer by activating the arsenic ions. Thus a MOS transistor 40 comprising the gate oxidation film 8, the gate electrode 9 and the impurity-doped layer 11 is formed.

Then after depositing the silicon oxide film 12 having a thickness of about 1000 Å by the CVD process, a boron phosphate glass 13 is deposited by the CVD process. After reflowing the boron phosphate glass 13 through heat treatment applied in nitrogen atmosphere at 850° C. for 30 minutes, a resist pattern (not shown) is formed by the photolithography technology. The resist pattern is used as a mask in etching the boron phosphate glass 13 and the silicon oxide film 12 to make contact holes (not shown), followed by deposition of an aluminum-silicon-copper alloy film by sputtering technique. Then a resist (not shown) is applied in a desired pattern by the photolithography technology, the resist pattern is used as a mask for etching the aluminum-silicon-copper alloy film, thereby to form an aluminum-silicon-copper wiring 14 and forming the semiconductor device shown in FIG. 1.

According to the first embodiment of the semiconductor device and the method of producing the semiconductor device, as described above, since the nitride layer having an effect of controlling the oxidation is formed on the inner surface of the groove by nitriding the silicon included therein after etching of the trench, volumetric expansion inside the trench can be controlled during oxidation such as gate oxidation after forming the trench, thereby making it possible to minimize the compressive stress generated by the volumetric expansion in the active region. Minimization of the stress in turn enables it to prevent crystalline defects from being generated in the silicon substrate, thus suppressing leak current caused by crystalline defect flowing through the NP junction. Further, since nitriding treatment is applied after the trench has been etched out and before the trench is filled up by the CVD oxidation or the like, the nitride layer can be formed on the inner surface of the trench. As the nitriding layer has a strong effect of suppressing oxidation, the semiconductor device capable of controlling the volumetric expansion in the trench can be produced also by oxidation such as gate oxidation after forming the trench isolation structure.

What is claimed is:

1. A semiconductor device, comprising:
   (a) substrate having a surface, said surface being formed with a groove to define a first region on one side of said groove and a second region on the opposite side of said groove;
   (b) first and second transistors provided in said first and second region, respectively,
      each of said first and second transistors having a gate oxidation film provided on said surface, a gate electrode provided on said gate oxidation film, and impurity-doped source/drain layers positioned on either side of said gate electrode and between said substrate and gate oxidation film;
   (c) an insulator in said groove; and
   (d) a nitride layer contacting the impurity-doped source/drain layer and positioned on a surface of said groove separating said insulator from a surface of said groove.

2. The semiconductor device according to claim 1, wherein said nitride layer is formed on the full surface of said groove.

3. The semiconductor device according to claim 1, further comprising an oxidation film formed on the surface of the groove, wherein said nitride layer is provided by nitriding said surface of the groove through an oxidation film.

4. The semiconductor device according to claim 1, wherein said insulator is an oxidation film formed by CVD method.

5. The semiconductor device according to claim 1, wherein said nitride layer is formed to prevent said surface of the groove from being oxidized.

6. A semiconductor device comprising:
   a substrate having a groove defining a first region on one side of the groove and a second region on an opposite side of the groove;
   at least one transistor formed in at least one of the first region and the second region, the at least one transistor having a first impurity-doped source/drain region laterally spaced from a second impurity-doped source/drain region by an intermediate region;
   a nitride barrier contacting the impurity-doped source drain region and overlying the groove; and
   a dielectric layer overlying the nitride barrier and composed at least partially of an oxidizing agent.

7. The semiconductordevice according to claim 6, wherein the nitride layer is formed on an entire groove surface of the groove.

8. The semiconductor device according to claim 6, wherein the dielectric layer comprises an oxidation film.

9. The semiconductor device according to claim 6 wherein the first impurity-doped region comprises a source of the at least one transistor and the second impurity-doped region comprises a drain of the at least one transistor.

10. The semiconductor device according to claim 9 wherein the intermediate region comprises an enhancement region.

11. The semiconductor device according to claim 9 wherein the intermediate region comprises a depletion region.

* * * * *